United States Patent
Hong

(10) Patent No.: US 6,175,127 B1
(45) Date of Patent: Jan. 16, 2001

(54) STACK CAPACITOR HAVING A DIFFUSION BARRIER

(75) Inventor: Suk Kyoung Hong, Ichon-shi (KR)

(73) Assignee: Hyundai Electronics Industries Co., Kyoungki-do (KR)

( * ) Notice: Under 35 U.S.C. 154(b), the term of this patent shall be extended for 0 days.

(21) Appl. No.: 09/349,492

(22) Filed: Jul. 9, 1999

(30) Foreign Application Priority Data

Aug. 27, 1998 (KR) .................................................. 98-35021

(51) Int. Cl.$^7$ .................................................. H01L 29/72
(52) U.S. Cl. .......................... 257/295; 257/310; 257/532; 257/754
(58) Field of Search .................................. 257/295, 310, 257/532, 754

(56) References Cited

U.S. PATENT DOCUMENTS

| | | | |
|---|---|---|---|
| 5,856,704 | * | 1/1999 | Schuele .................................. 257/754 |
| 5,877,062 | | 3/1999 | Horii ...................................... 438/396 |

* cited by examiner

*Primary Examiner*—Edward Wojciechowicz
(74) *Attorney, Agent, or Firm*—Nath & Associates; Gary M. Nath; Harold L. Novick

(57) ABSTRACT

A stack capacitor including a lower electrode connected to a semiconductor substrate via a polysilicon contact plug, a diffusion barrier layer formed at an interface between the contact plug and the lower electrode, the diffusion barrier layer being made of a material of $Ti_{1-x}Cr_xN$ ($0 \leq x \leq 1$), and a dielectric film and an upper electrode sequentially formed over a surface of the lower electrode opposite to the interface. The diffusion barrier serves to inhibit an oxidation of the polysilicon contact plug while preventing an increase in contact resistance resulting from a reaction of the polysilicon of the contact plug with the lower electrode. The dielectric film is comprised of a high-dielectric thin film so that it provides, to the capacitor, a sufficient capacitance for a high integration of a semiconductor device. The lower electrode is made of a material exhibiting superior electrical conductivity, thermal resistance and anti-oxidation characteristics. The stack capacitor achieves a high integration of semiconductor devices and an improvement in the characteristics and reliability of those semiconductor devices.

4 Claims, 2 Drawing Sheets

STACK CAPACITOR HAVING A DIFFUSION BARRIER

BACKGROUND OF THE INVENTION

1. Field of the Invention

The present invention relates to a highly integrated memory device having a stack capacitor structure in which a transistor and a capacitor included in each cell of the memory device are coupled to each other by a polysilicon contact plug in order to achieve an increase in the cell integration degree of the memory device, and more particularly to a stack capacitor in such a memory device, wherein a capacitor has a diffusion barrier capable of inhibiting an oxidation of the polysilicon contact plug while preventing an increase in contact resistance resulting from a reaction of the polysilicon of the contact plug with a lower electrode.

2. Description of the Prior Art

Referring to FIG. 1, there is a sectional view schematically illustrating a simple stack capacitor used in a conventional DRAM device.

As shown in FIG. 1, a lower insulating layer 13, which has storage electrode contact holes 15, is formed over a semiconductor substrate 11. Polysilicon is buried in the contact holes 15, thereby forming contact plugs 17.

Thereafter, a diffusion barrier layer 19 and a lower electrode layer for forming lower electrodes 21 are sequentially formed to desired thicknesses over the entire upper surface of the resulting structure.

The lower electrode layer and diffusion barrier layer 19 are then patterned in accordance with an etch process using a storage electrode mask (not shown), thereby forming diffusion barriers 19 and lower electrodes 21.

Over the entire upper surface of the resulting structure, a dielectric film 23 and a plate electrode layer for forming plate electrodes 25 as upper electrodes are then formed. Thus, stack capacitors are fabricated.

The stack capacitors are electrically connected to transistors formed on the semiconductor substrate 11 via the contact plugs 17, respectively.

The dielectric film 23 is made of a paraelectric or ferroelectric substance exhibiting a very high dielectric constant. Such a paraelectric or ferroelectric substance may be $SrTiO_3$ (ST), $(Ba_x, Sr_{1-x})TiO_3$ (BST), $Pb(Zr_x, Ti_{1-x})O_3$ (PZT), or $(Pb_{1-y}, La_y)(Zr_xTi_{1-x})O_3$ (PLZT)

Typically, such a high-dielectric thin film should be deposited or annealed in an oxygen atmosphere maintained at a high temperature of 500 to 800° C. so that it exhibits a desired dielectric constant and leakage current characteristics.

For the material of electrodes used in simple stack capacitors including dielectric films exhibiting a high electric constant, accordingly, a metal such as Pt, Ir or Ru or a conductive oxide such as $IrO_2$ or $RuO_2$ is typically used which exhibits a superior electrical conductivity and superior thermal resistance and anti-oxidation characteristics is typically used.

However, since the above-mentioned high-dielectric thin film made of, for example, ST, BST, PZT or PLZT is deposited in an oxygen atmosphere at a high temperature, oxygen may be easily diffused through the lower electrodes of the capacitors, so that it may react with the polysilicon of the contact plugs. As a result, an insulating layer such as a silicon oxide film may be formed at the interface of the polysilicon with the lower electrodes. That is, there is a problem in that an undesirable electrical insulation is established.

Meanwhile, Si may also be diffused into the lower electrodes. Such a diffusion of Si may result in a degradation in the physical properties of the deposited high-dielectric thin film.

Furthermore, when the material of the lower electrodes of the capacitors come into direct contact with the polysilicon, a reaction between these two materials may occur at a high temperature of 200° C. or more, thereby producing PtSi exhibiting Schottky barrier characteristics. This results in a degradation in CMOS characteristics.

In order to inhibit an oxidizing diffusion of oxygen and Si atoms while preventing Si from coming into direct contact with the lower electrodes, a diffusion barrier layer is typically disposed between the lower electrodes of the stack capacitors and the Si layer.

In a highly integrated DRAM, such a diffusion barrier layer is mainly made of TiN having a resistivity while exhibiting superior diffusion barrier characteristics at a temperature of 600° C. or less.

However, TiN loses its diffusion barrier effect to oxygen and Si in an oxygen atmosphere maintained at a high temperature of more than 600° C. For this reason, TiN serves to greatly limit processing conditions including the deposition temperature of the high-dielectric thin film and the temperature of a subsequent thermal treatment.

SUMMARY OF THE INVENTION

Therefore, an objective of the invention is to solve the above mentioned problems involved in the prior art and to provide a stack capacitor having a diffusion barrier capable of inhibiting an oxidation of a polysilicon contact plug adapted to connect the stack capacitor to a transistor and preventing the interaction between the polysilicon of the contact plug and a lower electrode included in the stack capacitor.

In accordance with the present invention, a stack capacitor comprises a lower electrode connected to a semiconductor substrate via a polysilicon contact plug; a diffusion barrier layer formed at an interface between the contact plug and the lower electrode, the diffusion barrier layer being made of a material of $Ti_{1-x}Cr_xN$ ($0 \leq x \leq 1$); and a dielectric film and an upper electrode sequentially formed over a surface of the lower electrode opposite to the interface.

BRIEF DESCRIPTION OF THE DRAWINGS

Other objectives and aspects of the invention will become apparent from the following description of embodiments with reference to the accompanying drawings in which.

DESCRIPTION OF THE PREFERRED EMBODIMENTS

Figure 1:
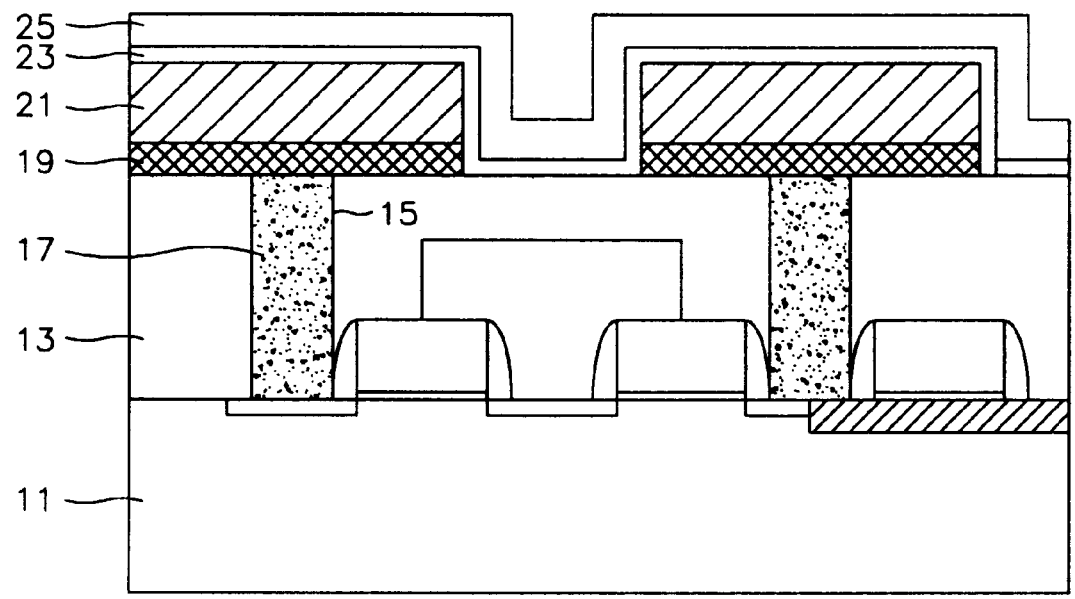
FIG. 1 is a sectional view illustrating a simple stack capacitor having a conventional structure.

Prior to the description of the preferred embodiments of the present invention, the principle of the present invention will be described.

A TiN thin film, which has been widely used in highly integrated DRAMs for a diffusion barrier layer interposed between a stack capacitor and a polysilicon contact plug, conducts an oxidation of "$TiN + 1/2O_2 \rightarrow TiO + N\uparrow$" when it is subjected to a thermal treatment in an oxygen atmosphere at a high temperature of about 600° C. or more, thereby forming a thin oxide layer of TiO.

As a result, the contact resistance of the contact plug, which serves as an electrical connection channel of the capacitor with a transistor, may greatly increase. In severe cases, an undesirable electrical insulation may occur.

Furthermore, bubbles are formed at the interface of the contact plug with a lower electrode (made of, for example, Pt) included in the capacitor due to a generation of $N_2$ gas. As a result, the structure of the stack capacitor may be damaged.

The oxidation of the nitride thin film, which is widely used as a diffusion barrier layer, is a thermally active reaction. Accordingly, this oxidation may be expressed by the Arrhenious equation having a temperature dependency of "k'(T)=$k_0$ exp(-Ea/kT)" (here, "k" represents a Boltzmann constant, "T" represents an oxidation temperature, and "Ea" represents energy activating the oxidation).

In accordance with the Wagner theory associated with a parabolic oxidation, the oxidation rate constant "k'(T)" has a relationship with the self diffusion coefficient of ions in the oxide layer and is determined by the activation energy "Ea" and the diffusivity prefactor "$k_0$".

Based on the comparison between "Ea" and "$k_0$", it is possible to select one of the various nitrides exhibiting superior electrical conductivity characteristics so that it is used for a diffusion barrier material for stack capacitors in a ULSI DRAM having a polysilicon plug structure. Based on the result of the selection, diffusion barriers are formed using the selected nitride. Thus, capacitors having the diffusion barriers made of a desired material are formed.

The following Table 1 describes the values of "Ea" and "$k_0$" associated with various nitrides.

TABLE 1

| Nitride Film | Activation Energy (Ea (eV)) | Diffusivity Prefactor ($k_0$(μg/cm$_4$s)) |
| --- | --- | --- |
| TiN | 1.6–1.89 | 0.12–1.55 × $10^{10}$ |
| ZrN | 1.83–2.37 | 1.39 × $10^{10}$–4.35 × $10^{12}$ |
| CrN | 1.92 | 1.83 × $10^8$ |
| $Ti_{0.63}Zr_{0.37}N$ | 1.04 | 9.2 × $10^5$ |
| $Cr_{0.72}Ti_{0.28}N$ | 3.98–4.11 | 1.71 × $10^{15}$–7.42 × $10^{18}$ |
| TiN/CrN | 2.91 | 3.58 × $10^{13}$ |
| ZrN/CrN | <1.0 | — |

As is apparent from Table 1, the nitride of $Cr_{0.72}Ti_{0.28}N$ exhibits considerably high values of "Ea" and "$k_0$", as compared to TiN.

The nitride of $Ti_{1-x}Cr_xN$ (0≦x≦1) which is a solid solution of TiN and CrN exhibits a variation in the reaction rate constant "k'" and a variation in resistivity, depending on the Cr content "x" therein. In order to use this nitride of $Ti_{1-x}Cr_xN$ as a diffusion barrier material for a ULSI DRAM, it is necessary to determine an appropriate Cr content, taking into consideration the above two physical properties.

Now, a preferred embodiment of the present invention will be described in conjunction with a simple stack capacitor having a diffusion barrier made of $Ti_{1-x}Cr_xN$.

Figure 2:
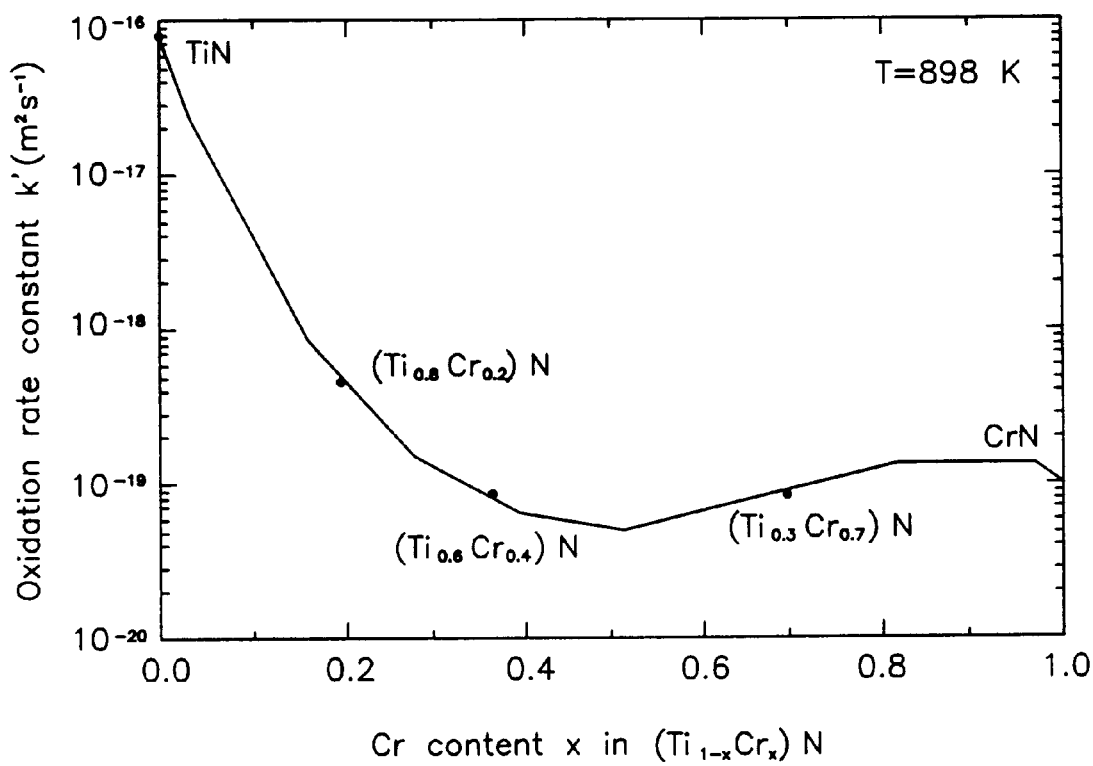
FIG. 2 is a graph depicting a variation in the oxidation rate constant at a temperature of 600° C., depending on the content of Cr in a $Ti_{1-x}Cr_xN$ diffusion barrier in accordance with an embodiment of the present invention.

Referring to FIG. 2, a graph is illustrated which depicts a variation in the oxidation rate constant at a temperature of 600° C., depending on the content of Cr in a $Ti_{1-x}Cr_xN$ diffusion barrier in accordance with an embodiment of the present invention.

The simple stack capacitor, which has a $Ti_{1-x}Cr_xN$ diffusion barrier in accordance with the present invention, has the same structure as that shown in FIG. 1, except that the diffusion barrier is made of $Ti_{1-x}Cr_xN$.

The deposition of the $Ti_{1-x}Cr_xN$ (0≦x≦1) thin film to be used as the diffusion barrier is carried out using a DC reactive sputtering process which is widely used for a metal wiring deposition in an Si semiconductor process.

In accordance with the DC reactive sputtering process, metal targets of Ti and Cr are used. In this case, the Cr content "x" in the composition of "$Ti_{1-x}Cr_xN$" can be easily adjusted by adjusting the mixture ratio of Ar and $N_2$ used as sputtering gas, the DC power applied to the Ti and Cr targets, and the distance between the substrate and each target, and the temperature of the substrate.

After the deposition, the $Ti_{1-x}Cr_xN$ (0≦x≦1) thin film is thermally treated at a temperature of about 600° C. in the atmosphere so that it is oxidized.

The thickness of the resulting oxide film can be measured by measuring the distribution of elements constituting the oxide film in the film thickness direction using an Auger electron spectroscopy.

The thickness "$d_{ox}$" of the oxide film can be expressed, in accordance with the parabolic oxidation law, as follows:

$$d_{ox} = \sqrt{2k't}$$

When the thickness dox of the oxide film measured as mentioned above is depicted with respect to the oxidation time "t", it has the form of a straight line. Based on the gradient of this straight line, it is possible to calculate the oxidation rate constant "k'".

By referring to FIG. 2, it can be found that the oxidation rate constant "k'" of the $Ti_{1-x}Cr_xN$ thin film decreases greatly at a rate corresponding to 1/100 to 1/1,000 of the oxidation rate constant of TiN as the Cr content "x" increases from 0 to 1.

In order to use the selected nitride for the diffusion barrier of the ULSI DRAM, it is also necessary to take into consideration the resistivity of the nitride thin film, in addition to the oxidation rate constant.

The resistivity of the $Ti_{1-x}Cr_xN$ thin film increases in the form of a straight line as the Cr content "x" increases. Taking into consideration both the oxidation rate and resistivity, accordingly, a nitride film of $Ti_{1-x}Cr_xN$, in which the Cr content "x" ranges between 0.2 and 0.7 (0.2≦x≦0.7), is suitable for the diffusion barrier.

As is apparent from the above description, the stack capacitor having a diffusion barrier according to the present invention provides various effects.

That is, there are various advantages in regard to manufacturing processes in that the deposition and thermal treatment temperature ranges for a high-dielectric film to be formed can greatly increase because a thin film of $Ti_{1-x}Cr_xN$ (0≦x≦1) exhibiting superior anti-oxidation characteristics over the conventional TiN film is used as a diffusion barrier film in accordance with the present invention.

Since the $Ti_{1-x}Cr_xN$ (0≦x≦1) thin film is used as a diffusion barrier film in accordance with the present invention, it is possible to inhibit an oxidation of a plug connecting the capacitor to a transistor while preventing a reaction of silicon with a lower electrode included in the capacitor.

The diffusion barrier film of the present invention also exhibits a considerably low resistivity as compared to the polysilicon contact plug. Accordingly, the diffusion barrier film of the present invention is suitable for use in a ULSI DRAM having a stack capacitor structure.

Although the preferred embodiments of the invention have been disclosed for illustrative purposes, those skilled in the art will appreciate that various modifications, additions and substitutions are possible without departing from the scope and spirit of the invention, as disclosed in the accompanying claims.

What is claimed is:

1. A stack capacitor comprising:

a lower electrode connected to a semiconductor substrate via a polysilicon contact plug;

a diffusion barrier layer formed at an interface between said contact plug and said lower electrode, said diffusion barrier layer being made of a material of $Ti_{1-x}Cr_xN$ ($0 \leq x \leq 1$); and a dielectric film and an upper electrode sequentially formed over a surface of said lower electrode opposite to said interface.

2. The stack capacitor as claimed in claim 1, wherein said lower electrode is made of a material exhibiting superior electrical conductivity, thermal resistance and anti-oxidation characteristics and being a metal selected from Pt, Ir and Ru, or a conductive oxide selected from $IrO_2$ and $RuO_2$.

3. The stack capacitor as claimed in claim 1, wherein the $Ti_{1-x}Cr_xN$ used for said diffusion barrier layer has a Cr content "x" ranging from 0.2 to 0.7 ($0.2 \leq x \leq 0.7$).

4. The stack capacitor as claimed in claim 1, wherein said dielectric film is comprised of a high-dielectric thin film made of a material selected from $SrTiO_3$ (ST), $(Ba_x, Sr_{1-x})TiO_3$ (BST), $Pb(Zr_x, Ti_{1-x})O_3$ (PZT), and $(Pb_{1-y}, La_y)(Zr_xTi_{1-x})O_3$ (PLZT).

* * * * *